(12) United States Patent
Fernihough (10) Patent No.: US 7,225,857 B2
(45) Date of Patent: Jun. 5, 2007

(54) APPARATUS FOR MANUFACTURE OF DIRECTIONALLY SOLIDIFIED COLUMNAR GRAINED ARTICLE THEREOF

(75) Inventor: John Fernihough, Ennetbaden (CH)

(73) Assignee: ALSTOM, Paris (FR)

( * ) Notice: Subject to any disclaimer, the term of this patent is extended or adjusted under 35 U.S.C. 154(b) by 0 days.

(21) Appl. No.: 10/929,692

(22) Filed: Aug. 31, 2004

(65) Prior Publication Data

US 2005/0028959 A1 Feb. 10, 2005

Related U.S. Application Data

(62) Division of application No. 10/355,138, filed on Jan. 31, 2003, which is a division of application No. 09/382,630, filed on Aug. 25, 1999, now Pat. No. 6,568,456.

(30) Foreign Application Priority Data

Aug. 11, 1999 (EP) .................................. 99810724

(51) Int. Cl.
*B23C 9/04* (2006.01)
(52) U.S. Cl. .................. 164/338.1; 164/122; 164/122.2
(58) Field of Classification Search ............. 164/122.2, 164/122.1, 122, 134, 358, 338.1, 516
See application file for complete search history.

(56) References Cited

U.S. PATENT DOCUMENTS

| | | |
|---|---|---|
| 1,793,672 A | 2/1931 | Bridgman |
| 3,248,764 A | 5/1966 | Chandley |
| 3,260,505 A | 7/1966 | Ver Snyder |
| 3,532,155 A | 10/1970 | Kane et al. |
| 3,536,121 A | 10/1970 | Piearcey |
| 3,580,324 A | 5/1971 | Copley et al. |
| 3,690,367 A | 9/1972 | Daniels |
| 3,763,926 A | 10/1973 | Tschinkel et al. |
| 4,180,119 A | 12/1979 | Burd et al. |
| 4,475,582 A | 10/1984 | Giamei et al. |
| 4,548,255 A | 10/1985 | Reiner et al. |
| 4,605,452 A | 8/1986 | Gemma et al. |
| 4,612,969 A | 9/1986 | Burd et al. |
| 4,714,101 A | 12/1987 | Terkelsen |

(Continued)

FOREIGN PATENT DOCUMENTS

EP 0082100 A2 6/1983

(Continued)

*Primary Examiner*—Len Tran
(74) *Attorney, Agent, or Firm*—Buchanan Ingersoll & Rooney PC (57) ABSTRACT

An apparatus for manufacturing a directionally solidified columnar grained article with a reduced amount of secondary misorientation of the columnar grains. The apparatus includes a casting assembly comprising a mold with a cavity, a selector section at a lower end of the mold, a heating chamber and a cooling chamber. The mold is fed with a liquid metal and then moved from the heating chamber to the cooling chamber where the columnar grained article is solidified. The article is solidified with at least two dendrites (or grains) emerging from the selector section and entering the main cavity of the shell mold. Further, the selector section is configured so that no dendrite or grain grows from the bottom of the selector section into the shell mold cavity along a continuous path of purely vertical growth.

20 Claims, 6 Drawing Sheets

U.S. PATENT DOCUMENTS

| | | | |
|---|---|---|---|
| 4,961,460 A * | 10/1990 | Butler et al. ................. | 164/134 |
| 5,062,468 A | 11/1991 | Monte et al. | |
| 5,161,602 A | 11/1992 | Chang et al. | |
| 5,173,255 A | 12/1992 | Ross et al. | |
| 5,234,047 A * | 8/1993 | Rose ........................... | 164/358 |
| 5,275,227 A | 1/1994 | Staub | |
| 5,611,670 A | 3/1997 | Yoshinari et al. | |
| 5,868,194 A * | 2/1999 | Horwood .................... | 164/456 |
| 5,899,257 A | 5/1999 | Alleweireldt et al. | |
| 6,217,286 B1 | 4/2001 | Huang et al. | |

FOREIGN PATENT DOCUMENTS

| | | |
|---|---|---|
| EP | 0749790 A1 | 12/1996 |
| FR | 2724857 A1 | 3/1996 |
| FR | 2734189 A | 11/1996 |

\* cited by examiner

APPARATUS FOR MANUFACTURE OF DIRECTIONALLY SOLIDIFIED COLUMNAR GRAINED ARTICLE THEREOF

This application is a divisional application of U.S. application Ser. No. 10/355,138 entitled DIRECTIONALLY SOLIDIFIED COLUMNAR GRAINED ARTICLE AND APPARATUS FOR MANUFACTURE THEREOF, filed Jan. 31, 2003 which is a divisional application of U.S. application Ser. No. 09/382,630, filed Aug. 25, 1999 (now U.S. Pat. No. 6,568,456) which claims priority of EPO 99810724.7, filed Aug. 11, 1999, the entire contents of each is hereby incorporated by reference.

TECHNICAL FIELD

The invention relates to an apparatus and a method for manufacturing a directionally solidified columnar grained article.

BACKGROUND OF THE INVENTION

The directional solidification process is a version of investment casting in which a cavity resembling the desired finished piece is defined by a ceramic shell mold. The mold is placed on a cooling surface, preheated to a desired temperature in a high temperature environment, filled with a liquid alloy, and withdrawn from the high temperature environment into a lower temperature environment (defined by a vacuum or liquid coolant or cooling by other means) at a specific rate so as to induce solidification of the liquid alloy in a directional fashion, starting at the cooling plate. A casting furnace is known for example from U.S. Pat. No. 3,532,155, furnaces working with gas cooling are known from the U.S. patent U.S. Pat. No. 3,690,367 or the European patent application EP-A1-749,790, and a LMC furnace is described in U.S. Pat. No. 3,763,926.

Directionally solidified articles with a columnar grain structure contain a multitude of grains oriented within a certain controlled and generally narrow range of angles relative to the main direction of stress in the article during service. For example, the direction of centrifugal force in a turbine blade is considered along the main axis of the blade and runs from root to blade tip. The preferred direction of grain growth is always parallel to the direction of heat flow during directional solidification.

Due to the nature of the directional solidification process, this main axis of the component to be solidified is normally oriented vertically so that the grains naturally grow along the main stress axis. The cooling plate is oriented horizontally. This is described by Chandley in U.S. Pat. No. 3,248,764 and by VerSnyder in U.S. Pat. No. 3,260,505. In these disclosures, an open-ended "starter zone" incorporated into the bottom of the ceramic casting mould is placed directly over a chill plate.

When liquid alloy is poured into the ceramic shell mold, it impinges on the chill plate and solidification starts immediately, where many randomly oriented grains begin growing at the chill plate. In a "starter zone" which restricts growth to the direction parallel to the imposed thermal gradient and solidification direction (perpendicular to the advancing solid front—perpendicular also to the cooling plate), the grains growing most closely to the direction of heat flow (in this case, the vertical) will grow the fastest and crowd out those that have larger angles to this preferred direction.

At leaving the exit of the starter section there are typically many grains growing approximately in the same direction. In this sense, starter zones are grain selectors in that they impede the growth of grains of undesirable crystallographic orientations into the article to be manufactured. Typical starter zones consist simply of rectangular or angled blocks connected directly to the article to be solidified with a columnar grained structure. Typically the growth direction is vertical and the chill plate and induced isotherms (and solid front) are horizontal. For columnar grained articles, the starter block is connected directly to an article-defining cavity in the shell mold.

A modification of this is given by U.S. Pat. No. 4,475,582, U.S. Pat. No. 4,548,255 and U.S. Pat. No. 4,180,119 in which a smaller starter block is used, at the top of which there is a helical "pig tail" type grain selector which is more effective than the vertically oriented starter—so much so that only one dendrite with an orientation very closely oriented to the vertical exits at the top of the helical selector and enters the article, thereby imparting the article with a single crystal grain structure. The helical selector, in effect, selects out the single best oriented dendrite or grain from those exiting the first starter which are generally vertically oriented but within a certain distribution of angles to the vertical. A less effective means of selecting a vertically oriented dendrite is with a simple thin and elongated growth section leading to the article-defining cavity, as disclosed by Bridgman in U.S. Pat. No. 1,793,672.

In both of the above cases (columnar grained and single crystal selectors) the selectors produce an array of grains or a single grain with random rotational orientations where the axis of rotation is equivalent to the direction of preferred growth (generally the vertical)—this is referred to as the secondary orientation. In many cases the random secondary orientation is not a problem for the design of a single crystal article (the well known advantages of a defined primary orientation are much more important) and hence many are cast with random secondary orientations. However in some cases there are definite advantages to growing a single crystal article having a defined secondary orientation.

For these cases there exist practices and disclosures for selecting grains with a controlled secondary orientation. These fall into two categories: using seed crystals (also described by Bridgman in U.S. Pat. No. 1,793,672) and using special grain selectors. Seed crystals are generally themselves small cylindrical single crystal castings fit into the bottom of the shell mold, and liquid metal filing the shell mold impinges on this rather than on a chill plate. If the seed crystal is properly used, solidification will start epitaxially at the seed-liquid interface, continuing desirable primary and secondary crystallographic orientations of the seed throughout the article-defining cavity.

These seed crystals are not without problems, being costly to produce and requiring special conditions during casting to produce the desired single grain in the article. To reduce the cost they are made small, but this also makes them difficult to handle and difficult to reuse. They constitute another handling operation for the shell mold and impose a holding chamber on the shell mold design. The cavities designed to contain the seeds must function precisely to avoid liquid metal leaking around the sides of the seeds which would nucleate new, randomly oriented grains. For this reason there are several disclosures for using single crystal selectors in addition to the seed in order to block out the continued growth of the random grains (see U.S. Pat. No. 4,714,101, U.S. Pat. No. 4,475,582). Finally, the small passage way containing the seeds and the passage from the seeds to the article-defining cavity in the shell mold almost completely eliminate any significant heat transfer through the metal to the cooling plate, thus slowing down solidification during the casting process. This increases the furnace time required to cast the part, and hence increases its cost.

Because of the problems associated with seeds there have also been disclosures of specially designed single crystal selectors which, by themselves, produce single grains with the desired primary vertical orientation and also a desired secondary orientation. For example, U.S. Pat. No. 3,580,324 discloses a selector with right angle bends and horizontal growth directions to select a secondary orientation. U.S. Pat. No. 5,062,468 discloses a selector design that produces dendrites which are almost always within +/−30° of the desired secondary orientation by using special horizontal growth sections. Numerous other disclosures are given for various means of selecting the secondary orientation of a single grain.

As discussed, there are sometimes advantages for controlling the secondary orientation of the grain for a single crystal article. For a columnar grained article, the random secondary orientation of the columnar grains with respect to the vertical has always been taken as unavoidable and is evidenced by the current standard practice of casting columnar grained articles with such grains of random secondary orientation. However, if it were to be desired to control the secondary orientation of these grains, seeds and selectors would still be the only possible means of achieving this. The same problems of seeds for single crystal articles would exist for seeds to be used for columnar grained castings— and would be much greater. The seeds, being composed of several individual single crystals and generally being much larger in surface area than seeds for single crystal articles would be very expensive. Fitting into the shell mold would be even more problematic. In fact, once a seed is going to be used, greater advantages in properties of the article and simplicity in seeding are maintained simply by using a single seed for the part. The multiple orientation seed is a contradiction in terms, since if all members in the seed were given the same orientation, a single crystal structure would result with the widely known superior properties over columnar grained articles.

SUMMARY OF INVENTION

It is object to the present invention to produce a novel structured columnar grained article, a method of producing it by means of a novel multiple grain selector and an apparatus for carrying out the method. The columnar grained article will have at least two columnar dendrites or grains having reduced secondary misorientation (compared to random) and may exhibit controlled secondary misorientation in a particular direction relative to some feature or dimension of the article. It is found that an array of growing dendrites can be used to select out a narrower than random distribution of secondary misorientations among several grains with nearly the same effectiveness as a specially designed single crystal selector does for a single grain.

The multiple grain selector consists of a portion of constrained growth in the main direction of heat flow during solidification (that is, the main direction of solidification) which acts to select grains with a desired primary orientation, and a portion which constrains the grains to grow at least partially in the horizontal (secondary) direction so that it is not possible for any grain or dendrite to grow from cooling plate to the article-defining cavity along a continuous path of purely vertical growth. The advantage of the novel structure is that it shows surprisingly stronger transverse properties (low cycle fatigue life, creep rupture life) than those in prior art columnar grained articles due to the reduced secondary misorientation of the columnar grained article.

This will be achieved for a relatively low incremental cost over the normal process and much lower costs in comparison to using multiple seeds or multiple single crystal selectors known from the state of the art.

Another advantage comes from the possibility of choosing a desired secondary orientation relative to the article or some feature of the article (not just the relative misorientation between adjacent grains or dendrites). For example, it may be preferred to center the distribution of secondary orientations around the main direction of transverse loading in the columnar grained article, so as to further maximise transverse lifetime.

A further advantage of this invention over the prior art of single crystal selectors is that the selectors disclosed herein are much larger and more robust than the smaller selector sections known in the state of the art, and will not suffer from the fragility of the prior art selectors often leading to mold cracking during handling or casting.

A further advantage of the present invention over prior art selectors is that, due to the relatively large cross section of the multi-grain selector, there will still be a substantial amount of heat flow through the metal in the selector to the cooling plate. In some possible embodiments of the invention, with small selector chambers, there will not be a large difference in heat flow to the cooling plate compared to the prior art columnar grained casting processes. This will maintain rapid solidification at the start of casting and help to keep furnace-usage time costs to a minimum.

It will be understood that although the following drawings show relatively large sections for the sake of clarity, the practical use of this invention will minimize the entire selector section size as much as possible to minimize heat flow impacts.

PREFERRED EMBODIMENT OF THE INVENTION

The present invention relates to an apparatus and a method for manufacturing a directionally solidified columnar grained article and to the columnar grained article itself. As shown in FIGS. 1 to 8 the invention will be carried out with a selector section 1 of a casting furnace. In principle any known type of directional solidification process and casting furnace can be used (power-down, Bridgman as disclosed in U.S. Pat. No. 3,532,155, Liquid Metal Cooling known from U.S. Pat. No. 3,763,926, other means of cooling e.g. casting furnaces from EP 749,790 or U.S. Pat. No. 3,690,367) according to the part to manufacture. Of greatest influence for the process are the parameters such as furnace design, rate of withdrawal of the mold from the heating chamber to the cooling chamber, shell mold conductivity and thickness, the type of alloy being cast, and the size and the design of the columnar grained article, which may range from small aerospace components to large land-based gas turbine blades and vanes. In general the selector section of the casting furnace is mounted on a cooling plate 2. For reasons of simplicity, the casting mold comprising a cavity is not shown but only the columnar grained article 3 to be directionally solidified from the liquid cast. The upper heating chamber and lower cooling chamber are omitted as well, but it is understood that the withdrawal is from the heating chamber to the cooling chamber with a direction of solidifying 4 from the bottom of the mold to the top of columnar grained article 3.

The columnar grained article 3 growing out of the selector section 1 has at least two columnar dendrites or grains having reduced secondary misorientation (compared to random) and may exhibit controlled secondary misorientation in a particular direction relative to some feature or dimension of the columnar grained article 3. It was found that an array of growing dendrites can be used to select out a narrower than random distribution of a secondary misorientations among several grains with nearly the same effectiveness as a specially designed single crystal selector section does for a single grain.

Figure 1:
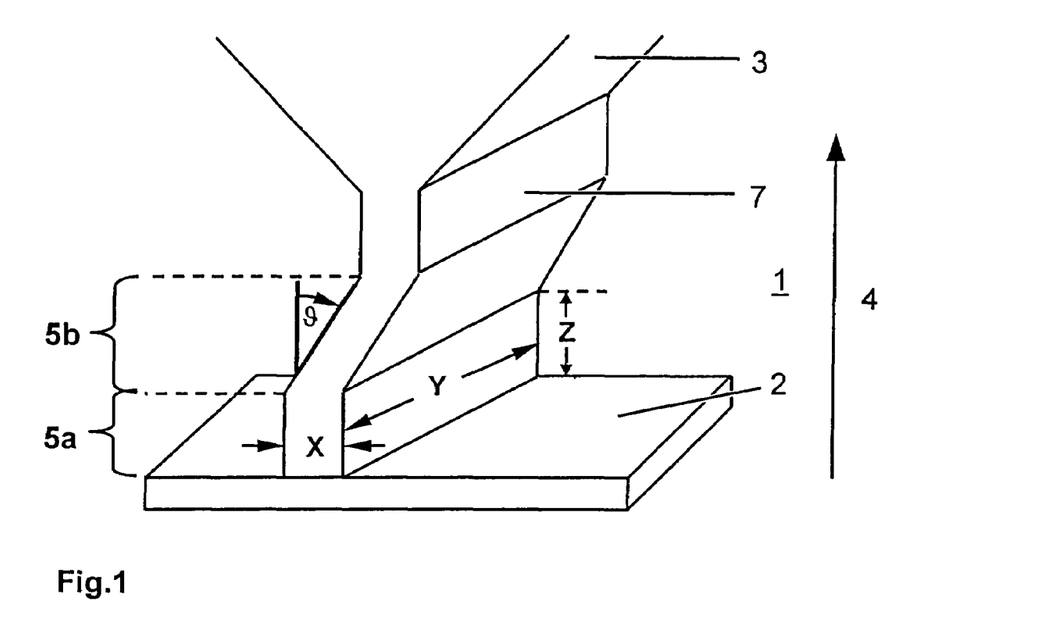
FIG. 1 shows an embodiment according to the invention of a selector section of a casting mold wherein the selector section rests on a cooling plate and comprises a primary selector section and an upwardly inclined secondary selector section.

FIG. 1 shows a first embodiment according the invention. A selector section 1 on a cooling plate 2 is shown. The selector section 1 is divided into two stages, the primary selector section 5a and the secondary selector section 5b. The primary selector section 5a of the selector section 1, which is rectangular in cross section in this embodiment and has the dimensions thickness X, length Y and height Z, consists of vertically constrained growth which selects out during solidification those dendrites most favorably oriented with respect to the growth direction 4 but still having random secondary orientations. This is followed by the secondary selector section 5b of imposed growth at an angle to vertical theta ($\theta$) which may vary from 1° to 135°. In a preferred embodiment $\theta$ has a range from 5° to 90° for net horizontal growth component equal at least to the average thickness of the selector passage in this region so that it is not possible for any dendrite to grow from the primary selector section 5a into the shell cavity of the columnar grained article 3 without undergoing growth in the secondary direction. This minimum amount of horizontal growth may be sufficient for some applications, but larger amounts may be required for others and will depend on the degree of secondary orientation control desired (more horizontal growth produces greater secondary orientation control) and the size and design of the columnar grained article 3.

FIG. 1 shows a first embodiment according the invention. In principle a selector section 1 on a cooling plate 2 is shown. The selector section 1 is divided into two stages, the primary selector section 5a and the secondary selector section 5b. The primary selector section 5a of the selector section 1, which is rectangular in cross section in this embodiment and has the dimensions thickness X, length Y and height Z, consists of vertically constrained growth which selects out during solidification those dendrites most favorably oriented with respect to the growth direction 4 but still having random secondary orientations. This is followed by the secondary selector section 5b of imposed growth at an angle to vertical theta ($\theta$) which may vary from 1° to 135°. In a preferred embodiment it has a range from 5° to 90° for net horizontal growth component equal at least to the X (which is equal the average thickness of the selector passage in this region) so that it is not possible for any dendrite to grow from the primary selector section 5a into the shell cavity of the columnar grained article 3 without undergoing growth in the secondary direction. This minimum amount of horizontal growth may be sufficient for some applications, but larger amounts may be required for others and will depend on the degree of secondary orientation control desired (more horizontal growth produces greater secondary orientation control) and the size and design of the columnar grained article 3. In FIG. 1 there is between the secondary selector section 5b and the columnar grained article 3 a leading passage 7.

Figure 1A:
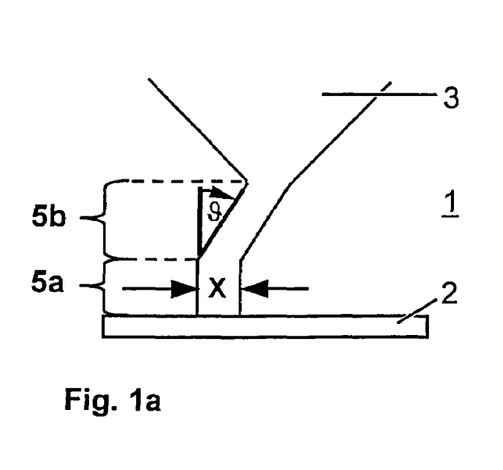
FIG. 1a shows a cross section through a variant of the embodiment according to FIG. 1 with no leading passage from the starter section to the mold cavity.
Figure 1B:
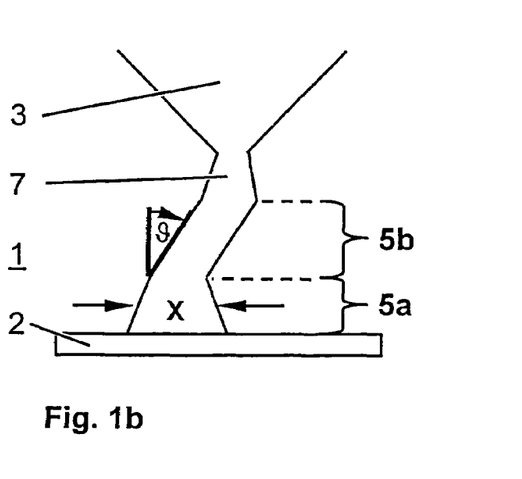
FIG. 1b shows a cross section through a variant of the embodiment according to FIG. 1 with a tapered primary selector section and a tapered leading passage from the selector section to the mold cavity.

FIG. 1 shows an embodiment where there is a leading passage 7 between the secondary selector section 5b and the cavity defining the columnar grained article 3. The leading passage 7 may have zero length which means a direct connection between the secondary selector section 5b and the cavity defining the columnar grained article 3. This embodiment is shown in FIG. 1a. As shown in FIG. 1b, the leading passage 7 may also be tapered or have any cross sectional shape. Further, the sides of the primary and secondary selector sections 5a and 5b need not be parallel. This embodiment is also shown in FIG. 1b.

There is no upper limit to the dimensions of thickness X and length Y of primary selector section 5a although there is no significant benefit for Y being more than 50% longer than the overlying columnar grained article 3 dimension (airfoil chord, for example). The selector section 1 may have varying dimensions X and Y, may be irregularly shaped, or may take on any regular shape including curves or straight edged shapes. The selector section 1 may be shaped so as to conform in cross section some part of the columnar grained article 3 being cast, for example, the airfoil of a turbine blade. These basic design principles are applicable to all embodiments disclosed within the FIGS. 1 to 7 except where special changes are noted within this description.

Figure 2:
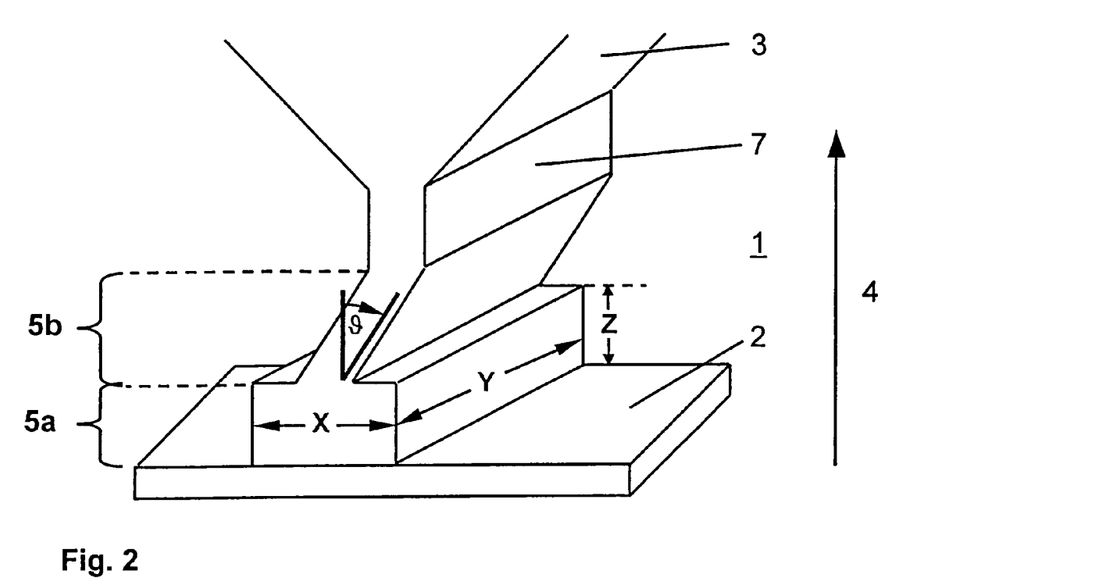
FIG. 2 shows a second embodiment according the invention comprising a selector section resting on a cooling plate and having a primary selector section which is larger than the secondary selector section.

A second embodiment of the invention is shown in FIG. 2. The primary selector section 5a is enlarged compared to the thickness of the secondary selector section 5b. The primary selector section 5a may also be tapered into the secondary selector section 5b and may be of any shape so long as solidification is constrained to take place in the vertical direction. This variation is shown in FIG. 2b. The leading passage 7 is omitted in the embodiment of FIG. 2b.

Figure 2A:
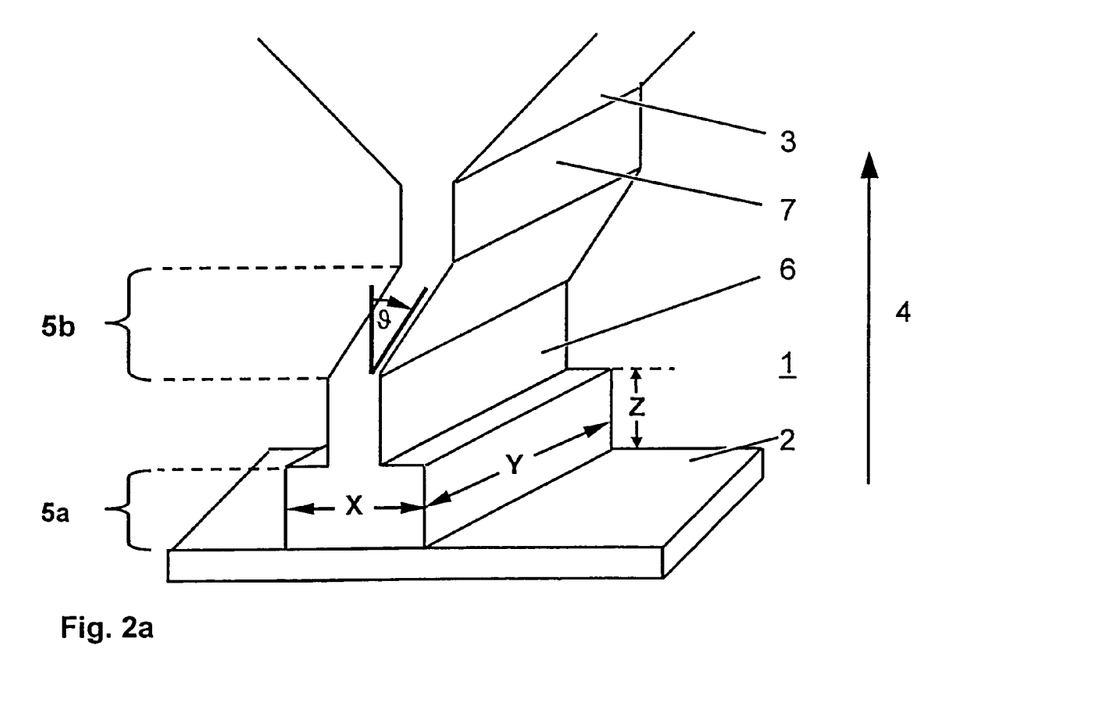
FIG. 2a shows a variation of the embodiment according to FIG. 2 with a restricted connection between the enlarged primary selector section and the secondary selector section.
Figure 2B:
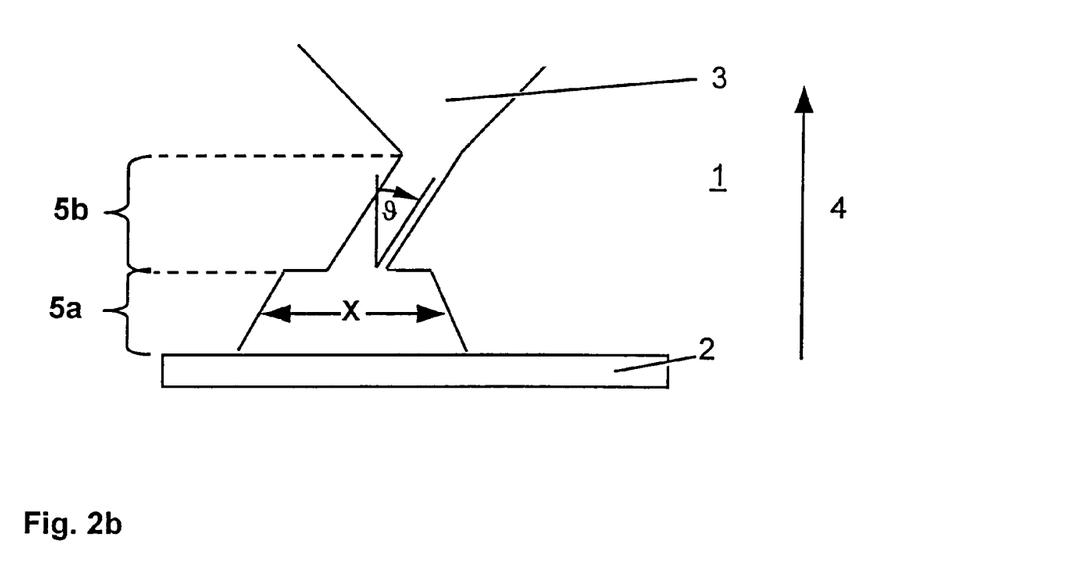
FIG. 2b shows a cross section through a variation of the embodiment according to FIG. 2 with an enlarged and tapered primary selector section and no leading passage from the selector section to the mold cavity.

As shown in FIG. 2a the primary selector section 5a may also have a constricted intermediate passage 6 of any length connecting it to the secondary selector section 5b which is more effective for vertical selection. The constricted passage 6 must be smaller in thickness than the base primary selector section 5a but may be the same thickness of the secondary selector section 5b.

Figure 3:
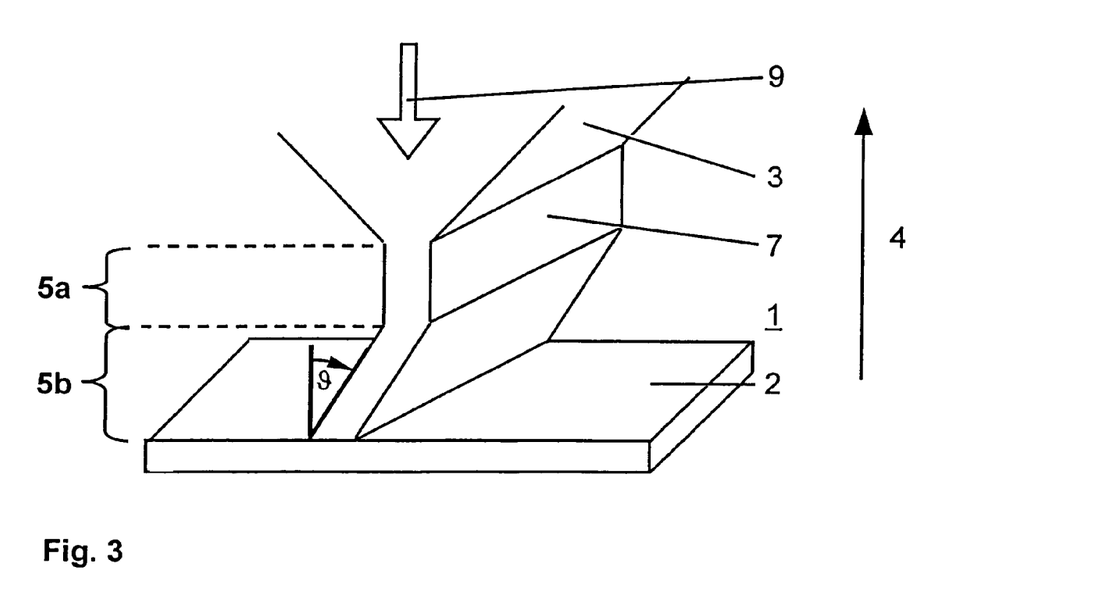
FIG. 3 shows a third embodiment according to the invention showing a selector section having a primary and a secondary selector section mounted directly on a cooling plate with the primary selector section on top of the secondary selector section.

FIG. 3 shows a third embodiment of the invention in which the primary selector section 5a is removed and the secondary selector section 5b directly contacts the cooling plate 2 and is left with the task of both primary and secondary selection, This arrangement may be possible under certain conditions of casting and would be advantageous to decrease the total height of the selector section 1. Alternatively, the primary selection may be carried out after the secondary as indicated in FIG. 3, with the abovementioned possible design variations on the primary selector section 5a still applicable (e.g. special shape). In this embodiment the leading passage 7 is equal to the primary selector section 5a. As shown in flaure 3, the liquid metal may be fed into the shell mold from an opening in the top of the casting furnace to descend into the selector section 1 cavities from above. The feeding direction 9 is indicated in FIG. 3 with an arrow.

Figure 4:
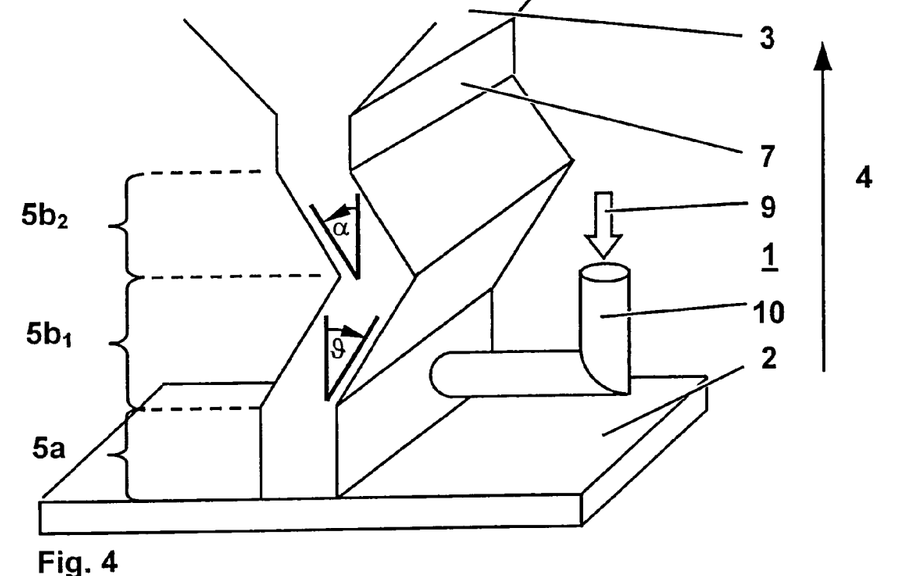
FIG. 4 shows a fourth embodiment according to the invention showing a selector section of a mold with a primary selector section, a first secondary selector section and a second secondary selector section, the first and the second secondary selector sections being upwardly inclined in different directions.
Figure 4A:
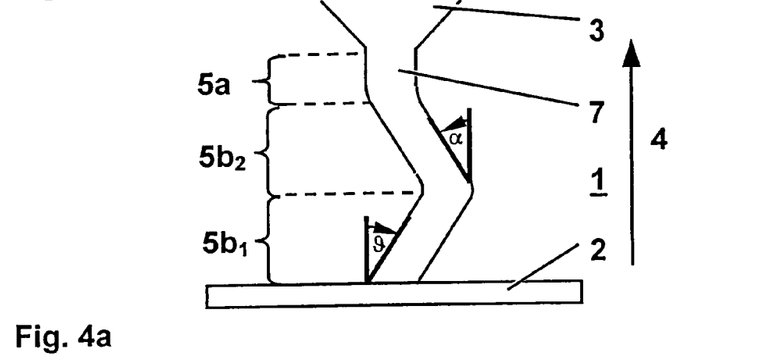
FIG. 4a shows a variation of a cross section through the embodiment of FIG. 4 with the primary selector section on top of the first and second secondary selector sections and wherein the first and second secondary selector sections are connected with a curved passage.
Figure 4B:
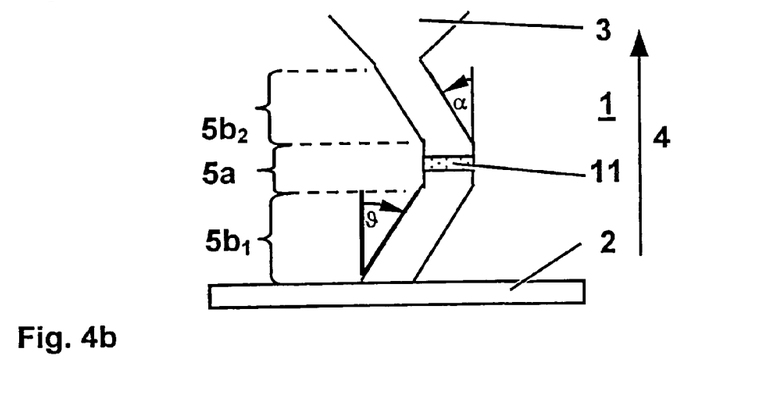
FIG. 4b shows a variation of a cross section through the embodiment according to FIG. 4 with the primary selector section between the first and second secondary selector sections.

FIG. 4 shows a fourth embodiment of the invention in which the secondary selector section 5b comprises two sections (the first secondary selector section $5b_1$ and the second secondary selector section $5b_2$) of to promote horizontal growth in opposite directions. This arrangement will be useful for selecting out those unwanted dendrites whose primary growth directions are oriented close to that of the secondary passages. The effectiveness with which this is done may be increased by varying, either independently or as functions of each other, the angles theta (θ) and alpha (α) which correspond respectively to the angles that the lower and upper passages make with respect to the vertical. For this reason, the primary selector section 5a may be excluded as a modification of the base design given in the drawing. As shown in FIG. 4a the primary selector section 5a may also be located above the secondary selector section 5b, or as shown in FIG. 4b between the two portions of the secondary selector section $5b_1$, and $5b_2$ which promote horizontal growth in opposite directions. FIGS. 4a and 4b show a variation of a cross section of the embodiment of FIG. 4. The two opposing portions of the secondary selector section $5b_1$, $5b_2$ may also be joined, rather than with a sharp angle, with a curved passage of desired radius of curvature. This can be seen in FIG. 4a. There is no maximum required net horizontal growth in the secondary selector section 5b, but the minimum is at least the thickness of the section in the region so that it is not possible for any vertically oriented dendrite to grow from the cooling plate 2 to the columnar grained article 3 without undergoing horizontal growth. As shown in FIG. 4 the invention may be modified so that instead of top feeding the liquid metal into the cavity of the casting furnace, it is bottom fed through an inlet 10 entering into any portion of the casting furnace below the columnar grained article 3 itself, e.g. into any part of the selector section 1 or the leading passage 7. Again, the feeding direction 9 is indicated with an arrow in FIG. 4. There may also be filters 11 placed into any part of the selector sections 5a, 5b, $5b_1$, $5b_2$ or passage 7 leading into the columnar grained article 3 to block the flotation of inclusions into the columnar grained article 3.

Figure 5:
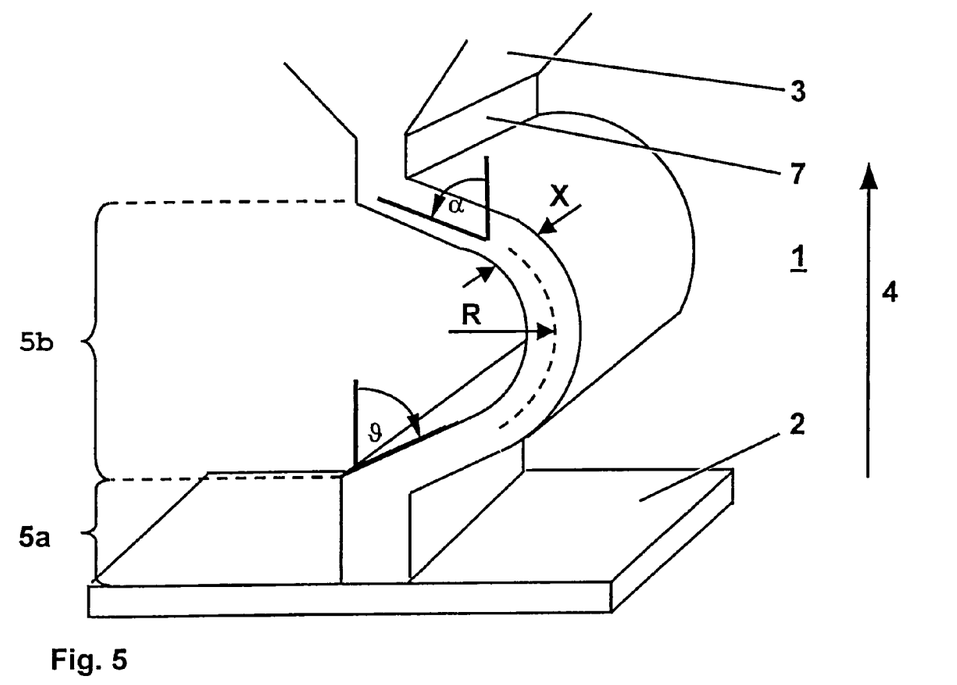
FIG. 5 shows a fifth embodiment according to the invention showing a selector section of a mold with a primary selector section and first and second secondary selector sections connected to each other by a curved connecting section.

FIG. 5 shows a fifth embodiment of the invention in which the secondary selector section 5b comprises two straight portions $5b_1$, $5b_2$ joined by a curved (in this embodiment semi-circular) passage of any radius R of curvature. The radius of curvature may be constant or changing throughout the curved portion. The two straight portions may be oriented independently or as functions of each other at angles to vertical as shown theta (θ) and alpha (α) both varying from 90° to 5°. The straight portions may also be excluded so that the secondary selector section 5b comprises nothing other than a continuous curved section joining the primary selector section 5a to the columnar grained article 3 or to the leading passage 7 The thickness X of the selector section 1 again may vary along the length of the selector cavities.

Figure 6:
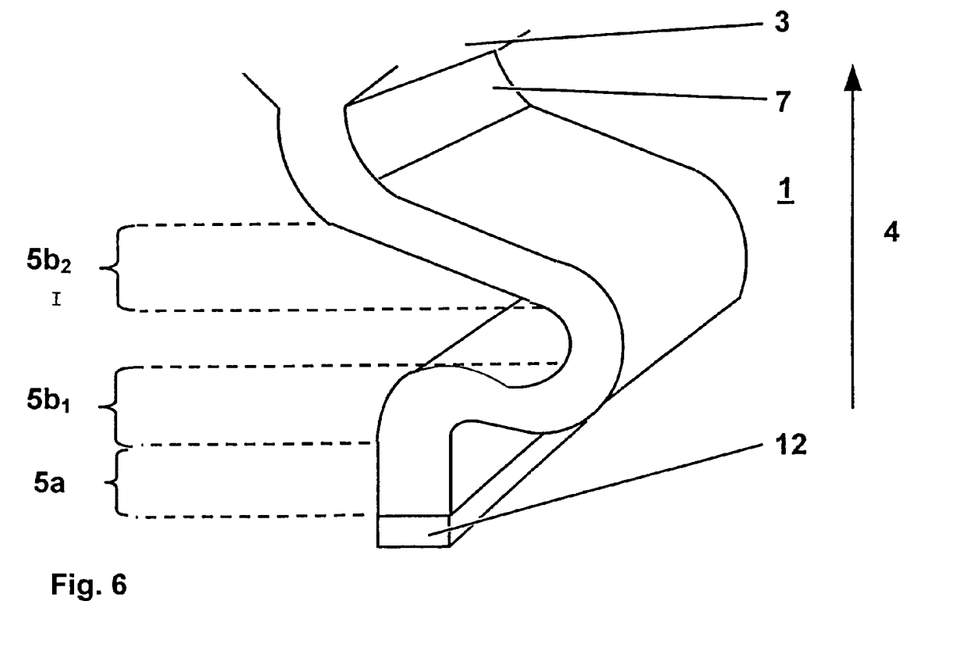
FIG. 6 shows a sixth embodiment according to the invention showing a selector section of a mold with a primary selector section, a first secondary selector section allowing grain growth in a downward direction, and a second secondary selector section allowing grain growth in an upward direction wherein the sections are connected with curved connection sections.

FIG. 6 shows a further embodiment of the invention in which a portion of the secondary selector section 5b undergoes growth with a component in the downward direction, or opposite to the main direction of solidification 4. Furthermore the directional solidification process may not incorporate a cooling plate 2. For example in some variations of the liquid metal cooling process, the selector section 1 cavity may be enclosed by a ceramic shell 12 or other insert material at its point of termination at the bottom. This is shown by FIG. 6.

Figure 7:
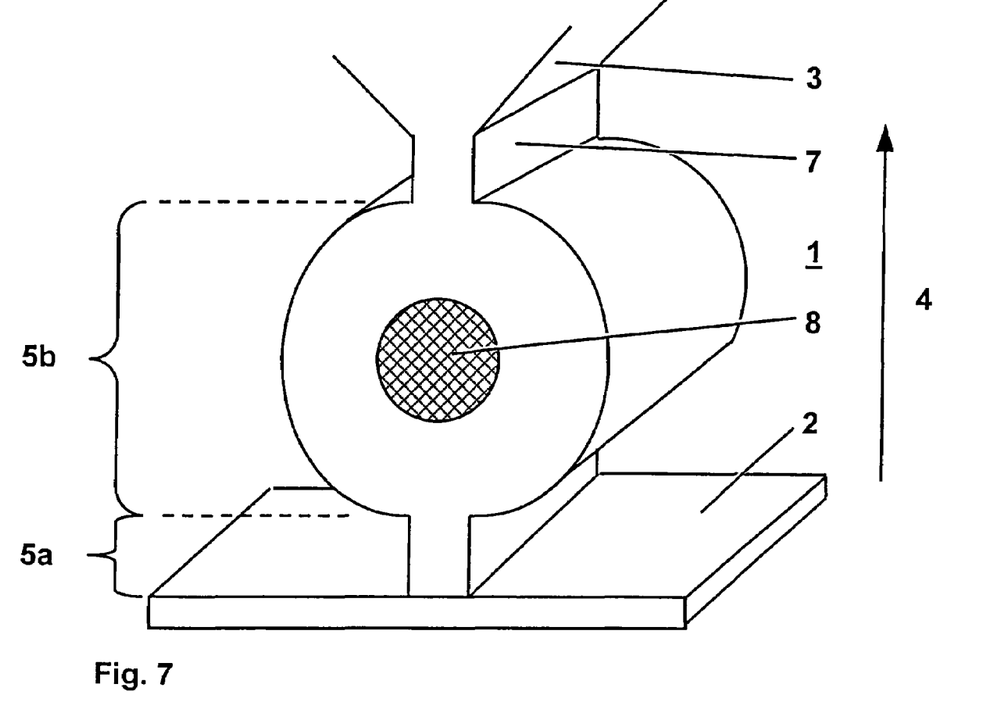
FIG. 7 shows a seventh embodiment according to the invention having a selector section with a primary selector section and a secondary selector section in a circular form with an insert in the middle.

FIG. 7 shows a further embodiment of the invention in which the secondary selector section 5b splits into two paths separated by a section of shell material, core material or a special insert 8 which remains solid during the casting process. The insert 8 may be of any cross-section shape: circular, elliptical, square, triangular, or any other regular or irregular shape. The secondary selector section 5b passages may likewise follow such a pattern of shapes or variations of shapes. There may be more than one such sections placed to block vertical growth.

The invention is not limited to the embodiment described herein. Any combination of designs of the above mentioned general embodiments may be used as such a multiple step secondary selector section using features taken from more than one design, or using the same selector section design twice. It is possible in any of the above mentioned designs of a selector section 1 that the functionality may be enhanced by the use of special high thermal conductivity or low thermal conductivity materials in any portion of the selector section 1 interior or on the selector section 1 to cooling plate 2 boundary or in conjunction with the shell mold on the selector section 1 surface. Furthermore in any of the above mentioned designs functionality can be enhanced by a locally or generally changing the surface emmissivity of the shell mold anywhere on the surface of the selector-defining cavities.

For all embodiments disclosed herein it is possible that a single mold for directional solidification contains a plurality of selector sections 1 and a plurality of columnar grained articles 3 in order to cast more than one columnar grained article 3 with reduced secondary misorientation simultaneously.

The resulting directionally solidified article has columnar-grained structure in which the columnar grains have a reduced amount of misorientation (compared to random) with respect to each other in the secondary orientation. This can be carried out in such a way that the direction around which the distribution of secondary orientations is centered is controlled with respect to some aspect or dimension of the columnar grained article 3 so as to achieve a desired effect. The distribution of secondary misorientations among the columnar grains of the columnar grained article 3 can be maintained within a maximum limit of approximately 30° or less, with a preferred range of 20° or less, with a most preferred range of 15° or less. The process can be carried out in such a way that the relative misorientations of the columnar grains is varied more or less in a continuous fashion along the transverse dimension of the columnar grained article 3. For example, the ,010. direction may be caused to be approximately perpendicular to the tangent of the airfoil surface at some height on a turbine blade or vane. The relative misorientation between the trailing edge grain and leading edge grain may in this case be quite large, approaching 45°.

In general the practice of using a multi-grain selector section 1 for the purpose of selecting, out a multitude of grains, only those that show a preferred orientation in approximately the same direction (primary) and with reduced rotational misorientation (secondary) with respect to each other where the axis of rotational misorientation is approximately the same as the preferred orientation of the grains. The selector section 1 can be positioned relative to the columnar grained article 3 so that the distribution of secondary orientations of the grains centers approximately around a desired secondary orientation.

The main advantage of this type of a multiple-grain selector section 1 and the resulting novel structure is the stronger transverse properties exhibited by the reduced misorientation columnar grained article. This will be achieved for a relatively low incremental cost over the normal process and much lower costs in comparison with multiple seeds or multiple single crystal selector section as known from the state of the art.

Another advantage comes from the possibility of choosing a desired secondary orientation (not just the relative misorientation between adjacent grains or dendrites). For example, it may be preferred to center the distribution of secondary orientations around the main direction of transverse loading in the columnar grained article, so as to further maximize transverse lifetime.

Figure 8:
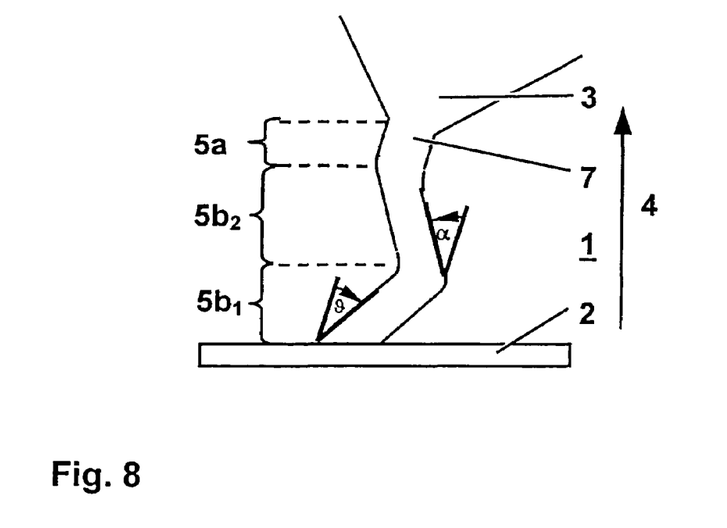
FIG. 8 shows a further embodiment according to the invention with a selector section as illustrated in FIG. 4a wherein the casting chamber is inclined at an angle to the vertical.

With some casting furnaces and mold cluster arrangements, it is advantageous to incline the selector section 1 and main cavity at an angle to the vertical (thereby inclining the primary direction of solidification to the vertical) in order to avoid certain casting defects. For this reason the entire selector section $5a$, $5b$, $5b_1$, $5b_2$ and the main cavity may be inclined at an angle to the vertical as illustrated in FIG. 8 But this is applicable to all embodiments disclosed in this description.

A further advantage of this invention over the prior art of single crystal selector sections is that the selector sections disclosed herein are much larger and more robust than the smaller selector sections known in the art. Therefore the selector sections of the invention will not suffer from the fragility of the prior art selector sections often leading to mold cracking during handling or casting.

A further advantage of the present invention over prior art selector sections is that, due to the relatively large cross section of the multi-grain selector section, there will still be a substantial amount of heat flow through the metal in the selector section to the cooling plate. In some possible embodiments of the invention, with small selector section chambers, there will not be a large difference in heat flow to the cooling plate compared to the prior art columnar grained casting processes. This will maintain rapid solidification and help to keep furnace-usage time costs to a minimum.

NUMBERING

1 Selector section
2 cooling plate
3 columnar grained article
4 direction of solidification
$5a$ primary selector section
$5b$ secondary selector section
$5b_1$ first secondary selector section
$5b_2$ second secondary selector section
6 restricted passage
7 leading passage
8 Insert
9 Feeding direction
10 Inlet
11 Filter
12 Ceramic shell
R Radius
X thickness
Y length
Z height
θ angle of secondary selector section $5b$, $5b_1$
α angle of second secondary selector section $5b_2$

The invention claimed is:

1. An apparatus for manufacturing a directionally solidified columnar grained article with a reduced amount of secondary misorientation, the apparatus comprising a mold with a cavity, a selector section at the lower end of the mold, a heating chamber and a cooling chamber wherein the selector section consists of at least one section of constrained growth in the main direction of solidification and at least one section that constrains the grains to grow at least partially in the horizontal (secondary) direction, wherein the selector section has a horizontal cross-section that is elongated having unequal dimensions on the same plane along two perpendicular directions of the horizontal cross-section and wherein the selector section effects constrained growth of the columnar grained article such that the secondary misorientation of columnar grains of the columnar grained article is less than 30°.

2. The apparatus of claim 1, wherein the selector section consists of a primary selector section which allows the growth of dendrites in a purely vertical direction and a secondary selector section which is inclined with an angle to vertical θ, whereby θ is in a range of 1° to 135°, and at least a height which disallows purely vertical growth of any single dendrite in the primary direction of solidification induced during casting from the point of origin to the columnar grained article.

3. The apparatus of claim 2, wherein the selector section consists of a first secondary selector section being inclined by an angle to vertical θ, and a second secondary selector section being inclined upwardly by an angle to the vertical α, wherein θ is in a range of 1° to less than 90° and α is in a range of 5 to less than 90°.

4. The apparatus of claim 3, wherein the primary selector section is located under, within or on top of the first and the second secondary section.

5. The apparatus of claim 3, wherein between the first secondary selector section and the second secondary selector section there is a curved connection.

6. The apparatus of claim 1, wherein the mold is a shell mold and between the selector section and the shell mold is a leading passage.

7. The apparatus of claim 6, wherein in any section of the selector sections cavities or passages connecting them or passages leading to the columnar grained article contain inserts or cores.

8. The apparatus of claim 7, wherein in any part of the selector sections or passage leading into the columnar grained article there is at least one filter.

9. The apparatus of claim 8, wherein the selector section consists of a combination of the selector sections, leading passage, inserts and filter.

10. The apparatus of claim 1, wherein the mold is a shell mold and the selector section is of high thermal conductivity or low thermal conductivity materials in a portion of the selector section interior or on a boundary between the selector section and a cooling plate or in conjunction with the shell mold on the selector section surface.

11. The apparatus of claim 1, wherein the selector section is mounted on a cooling plate.

12. The apparatus of claim 1, wherein the selector section is terminated at the bottom thereof by ceramic shell or other insert material.

13. The apparatus of claim 1, wherein the mold is a shell mold and the surface emmissivity of the shell mold of the selector section is changing anywhere on the surface of the selector-defining cavities from the normal emmissivity of the shell mold used.

14. The apparatus of claim 1, wherein the mold for directional solidification contains at least two selector sections and at least two columnar grained articles.

15. The apparatus of claim 1, wherein the selector section is positioned relative to the columnar grained article so that the distribution of secondary orientations of the grains centers approximately around a desired secondary orientation relative to the article or a feature thereof.

16. The apparatus of claim 1, wherein the mold is a shell mold and the selector section constrains the grains to grow in a net downward direction before entering the main cavity of the shell mold.

17. The apparatus of claim 1, wherein the entire selector section and the main cavity are inclined at an angle to the vertical.

18. The apparatus of claim 2, wherein θ is in a range of 5° to 90°.

19. The apparatus of claim 2, wherein the selector section has dimensions including a height Z, a width X and a length Y, the selector section including a primary selector section which is rectangular in cross-section taken in a plane of the X and Y dimensions.

20. The apparatus of claim 19, wherein the selector section includes a secondary selector section which is rectangular in cross-section taken in a plane of the X and Y dimensions.

* * * * *